US008773168B2

(12) United States Patent
Huang

(10) Patent No.: US 8,773,168 B2
(45) Date of Patent: Jul. 8, 2014

(54) MAXIMUM VOLTAGE SELECTION CIRCUIT AND METHOD AND SUB-SELECTION CIRCUIT

(71) Applicant: Lei Huang, Beijing (CN)

(72) Inventor: Lei Huang, Beijing (CN)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/913,719

(22) Filed: Jun. 10, 2013

(65) Prior Publication Data

US 2014/0002139 A1    Jan. 2, 2014

(30) Foreign Application Priority Data

Jun. 29, 2012 (CN) .......................... 2012 1 0227979

(51) Int. Cl.
*H03K 5/153*    (2006.01)
(52) U.S. Cl.
USPC ................................ 327/58; 327/99; 327/408
(58) Field of Classification Search
USPC ............................................. 327/58, 99, 408
See application file for complete search history.

(56) References Cited

U.S. PATENT DOCUMENTS

| 3,609,565 | A | * | 9/1971 | Arnold | 327/62 |
| 4,419,595 | A | * | 12/1983 | Reiner | 327/58 |
| 5,408,194 | A | * | 4/1995 | Steinbach et al. | 327/62 |
| 5,703,503 | A | * | 12/1997 | Miyamoto et al. | 327/58 |
| 5,905,387 | A | * | 5/1999 | Chinosi et al. | 327/62 |
| 6,118,307 | A | * | 9/2000 | Shi et al. | 327/58 |
| 6,188,251 | B1 | * | 2/2001 | Priemer et al. | 327/63 |
| 6,198,311 | B1 | * | 3/2001 | Shi et al. | 327/58 |

* cited by examiner

*Primary Examiner* — Kenneth B. Wells
(74) *Attorney, Agent, or Firm* — Schwegman, Lundberg & Woessner, P.A.

(57) ABSTRACT

A maximum voltage selection circuit and method and a sub-selection circuit are provided. The maximum voltage selection circuit includes a peripheral signal circuit and a selection circuit with N channels of input voltages. The peripheral signal circuit provides an operating mode signal and a reference voltage to the selection circuit including N sub-selection circuits coupled to the N channels of input voltages respectively. A sub-selection circuit determines its operating mode according to the operating mode signal. In the operating mode, when an input voltage of a sub-selection circuit is larger than the reference voltage, the sub-selection circuit sets itself to the output enable state and sets other sub-selection circuits to the output disable state, and outputs its input voltage as a maximum voltage through a PMOS.

20 Claims, 7 Drawing Sheets

MAXIMUM VOLTAGE SELECTION CIRCUIT AND METHOD AND SUB-SELECTION CIRCUIT

CLAIM OF PRIORITY

This application claims the benefit of priority to People's Republic of China Patent Application Serial No. 201210227979.7, filed Jun. 29, 2012.

BACKGROUND

A maximum voltage selection circuit is generally required in an integrated circuit. The main function of the maximum voltage selection circuit is to select and output a maximum voltage from a plurality of existing voltages to supply other circuits in the integrated circuit.

FIG. 1 is a maximum voltage selection circuit with three channels of voltages. As shown in FIG. 1, when the differences in voltage between a first input voltage VCC1, a second input voltage VCC2 and a third input voltage VCC3 are relatively large, the maximum voltage selection circuit can select a maximum voltage as an output voltage VMAX. However, since generally, neither of the first input voltage VCC1, the second input voltage VCC2 and the third input voltage VCC3 is zero volts, a gate connection of a P-type metal oxide semiconductor field effect transistor (PMOS) connected to one of the first input voltage VCC1, the second input voltage VCC2 or the third input voltage VCC3 may have inadequate driving capacity to provide the output voltage VMAX at the output of the maximum voltage selection circuit. Additionally, when the voltage differences between the first input voltage VCC1, the second input voltage VCC2 and the third input voltage VCC3 are relatively small or the voltages are the same, the PMOS devices in the maximum voltage selection circuit may not operate normally may not generate the output voltage VMAX.

OVERVIEW

This document discusses, among other things, devices systems and methods to select a maximum voltage in integrated circuits. An example of a sub-selection circuit includes an enable mode circuit and a disable mode circuit. The enable mode circuit can be configured to operate when an operating mode signal is an enable signal, employ a comparator structure, set its state as an output enable state and set states of the sub-selection circuits other than itself as output disable states, and output its input voltage as a maximum voltage via a PMOS transistor when its input voltage is larger than a reference voltage. The disable mode circuit can be configured to operate when the operating mode signal is an disable signal, employ a power latch structure, set its state as the output enable state and set the states of the sub-selection circuits other than itself as the output disable states, and output its input voltage as the maximum voltage via the PMOS transistor when its input voltage is larger than the reference voltage.

An example of a maximum voltage selection circuit includes a peripheral signal circuit and a selection circuit with N input voltages, wherein N is a positive integer greater than zero. The peripheral signal circuit can provide an operating mode signal and a reference voltage to the selection circuit. The selection circuit can include N sub-selection circuits, the N input voltages are correspondingly coupled to the N sub-selection circuits, each of the sub-selection circuits determines its operating mode according to the operating mode signal, sets its state as the output enable state and sets the states of the sub-selection circuits other than itself as the output disable states, and outputs its input voltage as a maximum voltage via a PMOS transistor when its input voltage is larger than the reference voltage in the operating mode.

An example of a maximum voltage selection method includes correspondingly transmitting N input voltages to the N sub-selection circuits. The method also includes each sub-selection circuit determining its operating mode according to a current operating mode signal, and each sub-selection circuit setting its state as the output enable state and setting the states of the other sub-selection circuits other than itself as the output disable state, and outputting its input voltage as a maximum voltage via a PMOS transistor when its input voltage is larger than the reference voltage in a determined operating mode.

A system example includes a maximum voltage selection circuit, a maximum voltage selection method and a sub-selection circuit. The maximum voltage selection circuit includes a peripheral signal circuit and a selection circuit with N input voltages, the peripheral signal circuit provides the operating mode signal and the reference voltage to the selection circuit. The selection circuit includes N sub-selection circuits, the N input voltages are correspondingly coupled to the N sub-selection circuits, each of the sub-selection circuits determines its operating mode according to the operating mode signal, and sets its state as the output enable state and sets the states of the sub-selection circuits other than itself as the output disable states, and outputs its input voltage as a maximum voltage via a PMOS transistor when its input voltage is larger than the reference voltage in the operating mode. Thus, the driving capability of the output voltage is increased, and the output voltage is ensured to be normal when the voltage differences between the multi-voltages are relatively small or the voltages are the same.

Also, the disclosure may set the sub-selection circuit according to the number of the voltages that are required to be compared, allowing the design and application of the maximum voltage selection circuit to be more flexible.

DETAILED DESCRIPTION

In general, a maximum voltage selection circuit selects and outputs a maximum voltage from a plurality of existing voltages. A maximum voltage selection circuit can be formed by a peripheral signal circuit and a selection circuit with N channels of input voltages; N being a positive integer greater than zero. The peripheral signal circuit provides an operating mode signal and a reference voltage to the selection circuit. The selection circuit can include N sub-selection circuits, and N input voltages coupled to the N sub-selection circuits respectively. Each of the sub-selection circuits determines its operating mode according to the operating mode signal, and when its input voltage is larger than the reference voltage in the operating mode, sets its state as the output enable state and sets the states of other sub-selection circuits as the output disable state, and outputs its input voltage as a maximum voltage through a PMOS transistor.

The subject matter of the present application is described in detail below with reference to the drawings and specific embodiments.

Figure 1:
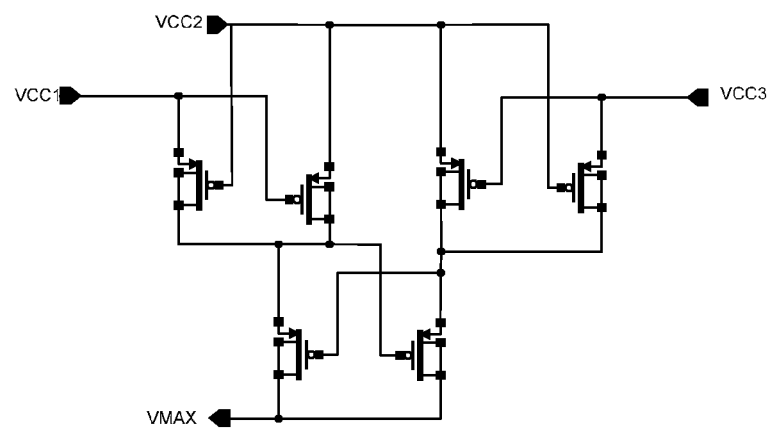
FIG. 1 is a schematic view of a maximum voltage selection circuit with three channels of voltages in the relevant art.
Figure 2:
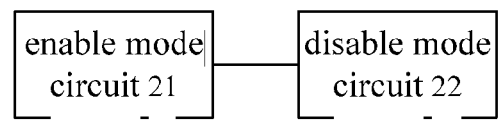
FIG. 2 is a schematic view of the structure of a sub-selection circuit according to some embodiments.

FIG. 2 shows an example of a sub-selection circuit. The sub-selection circuit includes an enable mode circuit 21 and a disable mode circuit 22.

The enable mode circuit 21 is configured to operate when an operating mode signal received at an input to the enable mode circuit 21 is an enable signal. The enable mode circuit includes a comparator. When an input voltage of the enable mode circuit is larger than a reference voltage, the enable mode circuit 21 sets itself to an output enable state, sets other sub-selection circuits to an output disable state, and outputs its input voltage as a maximum voltage through a PMOS transistor.

The disable mode circuit 22 is configured to operate when the operating mode signal is a disable signal. The disable mode circuit 22 includes a power latch. When an input voltage of the disable mode circuit is larger than the reference voltage, the disable mode circuit 22 sets itself to the output enable state, sets the other sub-selection circuits to the output disable state, and outputs its input voltage as the maximum voltage through the PMOS transistor.

When there is a bias current in the circuit, the operating mode signal having a high level is used as the enable signal. When there is no bias current in the circuit, the operating mode signal having a low level is used as the disable signal.

The reference voltage is the sum of a feedback voltage and voltages of related circuits. The feedback voltage is an output voltage of the maximum voltage selection circuit fed back based on the operating mode signal.

When N equals three, and there are three channels of input voltages, these three channels of input voltages are coupled to three sub-selection circuits described above respectively. Specifically, a first input voltage VCC1 is coupled to a first sub-selection circuit, a second input voltage VCC2 is coupled to a second sub-selection circuit, and a third input voltage VCC3 is coupled to a third sub-selection circuit.

Figure 3:
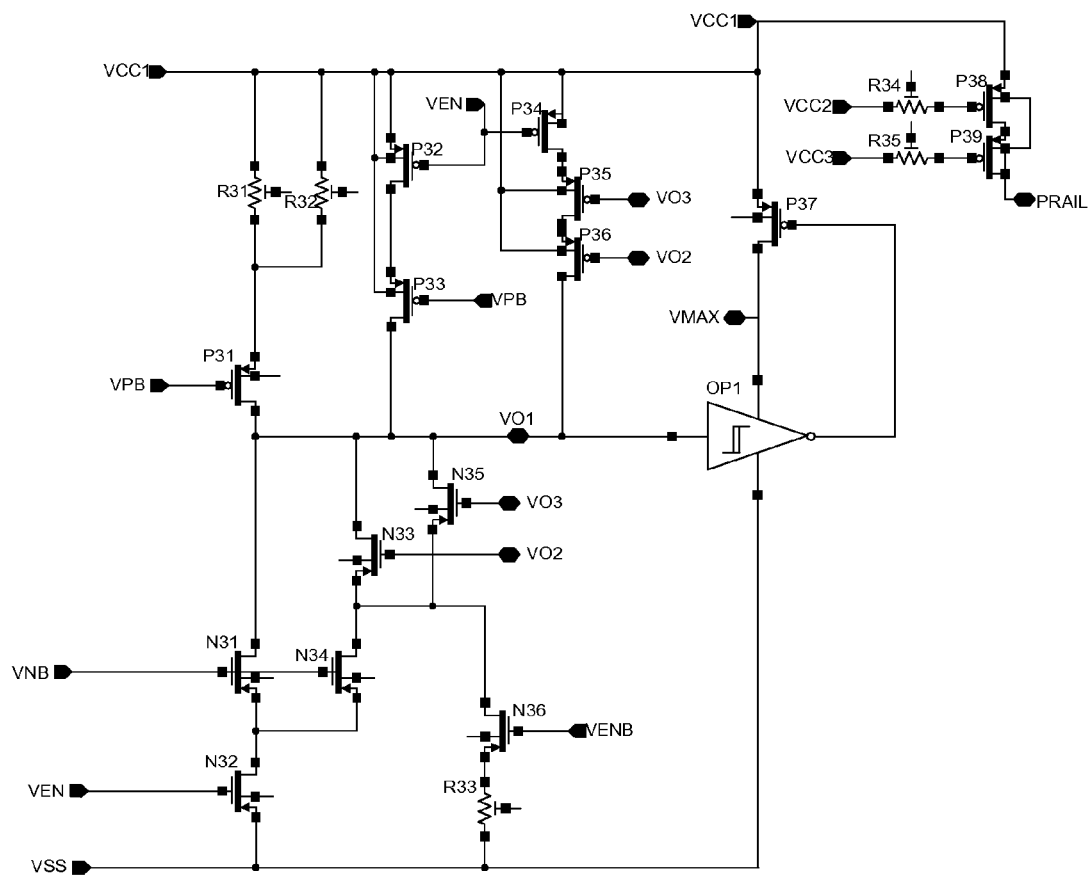
FIG. 3 is a schematic view of the specific structure of a first sub-selection circuit according to some embodiments.

Taking the first sub-selection circuit to which the first input voltage VCC1 is coupled as an example, the first sub-selection circuit, as shown in FIG. 3, includes a first resistor R31, a second resistor R32, a third resistor R33, a first PMOS transistor (or PMOS) P31, a second PMOS P32, a third PMOS P33, a fourth PMOS P34, a fifth PMOS P35, a sixth PMOS P36, a seventh PMOS P37, a first NMOS transistor (or NMOS) N31, a second NMOS N32, a third NMOS N33, a fourth NMOS N34, a fifth NMOS N35, a sixth NMOS N36, and an inverter OP1.

An end of the first resistor R31 and the second resistor R32 connected in parallel is connected to the first input voltage VCC1, another end is connected to the source of the first PMOS P31. The gate of the first PMOS P31 is connected to a feedback voltage VPB. The drain of the first PMOS P31 is its state node VO1, and is connected to the input of the inverter OP1 and the drain of the third PMOS P33, the drain of the sixth PMOS P36, the drain of the first NMOS N31, the drain of the third NMOS N33 and the drain of the fifth NMOS N35. The gate of the first NMOS N31 is connected to the gate of the fourth NMOS N34 and a control signal VNB corresponding to an operating mode signal VEN. The source of the first NMOS N31 is connected to the drain of the second NMOS N32 and the source of the fourth NMOS N34. The gate of the second NMOS N32 is connected to the operating mode signal VEN, and the source is connected to a ground voltage VSS. The gate of the third NMOS N33 is a node VO2 for receiving the state of the second sub-selection circuit, and the source of the third NMOS N33 is connected to the drain of the fourth NMOS N34, the source of the fifth NMOS N35 and the drain of the sixth NMOS N36. The gate of the fifth NMOS N35 is a node VO3 for receiving the state of the third sub-selection circuit. The source of the sixth NMOS N36 is connected to the ground voltage VSS through the third resistor R33, and the gate of the sixth NMOS N36 is connected to an inverted signal VENB of the operating mode signal VEN. The source of the second PMOS P32 is connected to the first input voltage VCC1, the gate of the second PMOS P32 is connected to the operating mode signal VEN and the gate of the fourth PMOS P34, and the drain of the second PMOS P32 is connected to the source of the third PMOS P33. The gate of the third PMOS P33 is connected to the feedback voltage VPB. The source of the fourth PMOS P34 is connected to the first input voltage VCC1, and the drain of the fourth PMOS P34 is connected to the source of the fifth PMOS P35. The gate of the fifth PMOS P35 is the node VO3 for receiving the state of the third sub-selection circuit, and the drain of the fifth PMOS P35 is connected to the source of the sixth PMOS P36. The gate of the sixth PMOS P36 is the node VO2 for receiving the state of the second sub-selection circuit. The source of the seventh PMOS P37 is connected to the first input voltage VCC1, the gate of the seventh PMOS P37 is connected to the output of the inverter OP1, and the drain of the seventh PMOS P37 is connected to the output voltage VMAX.

In a more specific implementation, the first resistor R31 and the second resistor R32 may be implemented as one resistor.

When the operating mode signal VEN is at a high level, the control signal VNB corresponding to the operating mode signal VEN is a bias voltage, causing a bias current and causing the first NMOS N31 and the fourth NMOS N34 to form a current mirror, and when VEN is at a low level, the control signal VNB is at a low level.

When the operating mode signal VEN is at the high level, the first resistor R31, the second resistor R32, the first PMOS P31, the seventh PMOS P37, the first NMOS N31, the second NMOS N32, the third NMOS N33, the fourth NMOS N34, the fifth NMOS N35 and the inverter OP1 form the enable mode circuit 21. The first resistor R31, the second resistor R32, the first PMOS P31, the first NMOS N31, the second NMOS N32, the third NMOS N33, and the fourth NMOS N34 form the comparator structure. When the first input voltage VCC1 is larger than the reference voltage, the drain current of the first PMOS P31 will be larger than the sum of the drain currents of the first NMOS N31 and the fourth NMOS N34, and thus, its state node VO1 is set to be at the high level, i.e., output enable state, resulting the second sub-selection circuit and the third sub-selection circuit to be in the output disable state through the state node VO1. That is, both the node VO2 and the node VO3 receive the low level, then the seventh PMOS P37 is turned on and the output voltage VMAX of the drain of the seventh PMOS P37 is the first input voltage VCC1. The reference voltage is the sum of the feedback voltage VPB and a voltage VGSP. The voltage VGSP is the sum of the gate-source voltage VGS of the first PMOS P31 and the voltage across the first resistor R31 or the second resistor R32 when the current of the first PMOS P31 is equal to the sum of the currents of the first NMOS N31 and the fourth NMOS N34.

Here, the seventh PMOS P37 in each of the other sub-selection circuits is turned off. In the sub-selection circuit under discussion, since both the third NMOS N33 and the fifth NMOS N35 are turned off in the current branch of the fourth NMOS N34, VCC1 may be maintained at the maximum value provided that the current of the first PMOS P31 is larger than that of the first NMOS N31. When a certain sub-selection circuit among the other sub-selection circuits is in the output enable state, in the sub-selection circuit under discussion, the current of the first PMOS P31 will be less than the sum of the currents of the first NMOS N31 and the fourth NMOS N34, thereby causing the sub-selection circuit under discussion into the output disable state, and the sub-selection circuit under discussion can be set to the output enable state only if the current of the first PMOS P31 is larger than the sum of the currents of the first NMOS N31 and the fourth NMOS N34.

When the operating mode signal VEN is at the low level, the third resistor R33, the second PMOS P32, the third PMOS P33, the fourth PMOS P34, the fifth PMOS P35, the sixth PMOS P36, the seventh PMOS P37, the third NMOS N33, the fifth NMOS N35, the sixth NMOS N36, and the inverter OP1 form the disable mode circuit 22. The third resistor R33, the second PMOS P32, the third PMOS P33, the fourth PMOS P34, the fifth PMOS P35, the sixth PMOS P36, the third NMOS N33, the fifth NMOS N35 and the sixth NMOS N36 form the power latch structure. When the first input voltage VCC1 is larger than the reference voltage, the third PMOS P33 is turned on, and thus, its state node VO1 is set to be at the high level, i.e., output enable state, resulting the second sub-selection circuit and the third sub-selection circuit to be in the output disable state through the state node VO1. That is, both the node VO2 and the node VO3 receive the low level, and all of the fourth PMOS P34, the fifth PMOS P35, and the sixth PMOS P36 are turned on, the output enable state of the state node VO1 is latched, the seventh PMOS P37 is turned on and the output voltage VMAX of the drain of the seventh PMOS P37 becomes the first input voltage VCC1. At this point, the seventh PMOS P37 in each of the other sub-selection circuits is turned off. The reference voltage is the sum of the feedback voltage VPB, a VGS1 of the third PMOS P33 and a VGS2 of the second PMOS P32. The on-resistance of the third PMOS P33 is less than that of the third NMOS N33 and the fifth NMOS N35, which can allow the voltage of the state node VO1 to reach the threshold of the inverter OP1 when the third PMOS P33 is turned on.

Here, the third NMOS N33, the fifth NMOS N35, the fourth PMOS P34, the fifth PMOS P35 and the sixth PMOS P36 form a NOR gate with two inputs. When one of the other two sub-selection circuits is in the output enable state, the sub-selection circuit under discussion will turn into the output disable state. With regard to N channels of input voltages, a NOR gate with N−1 inputs corresponding to the sub-selection circuits for the respective channels of input voltages are required to generate the output enable state.

The first sub-selection circuit also includes a fourth resistor R34, a fifth resistor R35, an eighth PMOS P38 and a ninth PMOS P39. The source of the eighth PMOS P38 is connected to the first input voltage VCC1, the gate of the eighth PMOS P38 is connected to the second input voltage VCC2 through the fourth resistor R34, and the drain of the eighth PMOS P38 is connected to the source of the ninth PMOS P39. The gate of the ninth PMOS P39 is connected to the third input voltage VCC3 through the fifth resistor R35, and the drain of the ninth PMOS P39 is a voltage-protection output node PRAIL. When the first input voltage VCC1 is the largest, both the eighth PMOS P38 and the ninth PMOS P39 are turned on, and the voltage-protection output node PRAIL is at the first input voltage VCC1.

The circuit structures of the second sub-selection circuit and the third sub-selection circuit are the same as the first sub-selection circuit. However, the second sub-selection circuit is to determine whether the second input voltage VCC2 is the maximum voltage and the third sub-selection circuit is to determine whether the third input voltage VCC3 is the maximum voltage.

Figure 4:
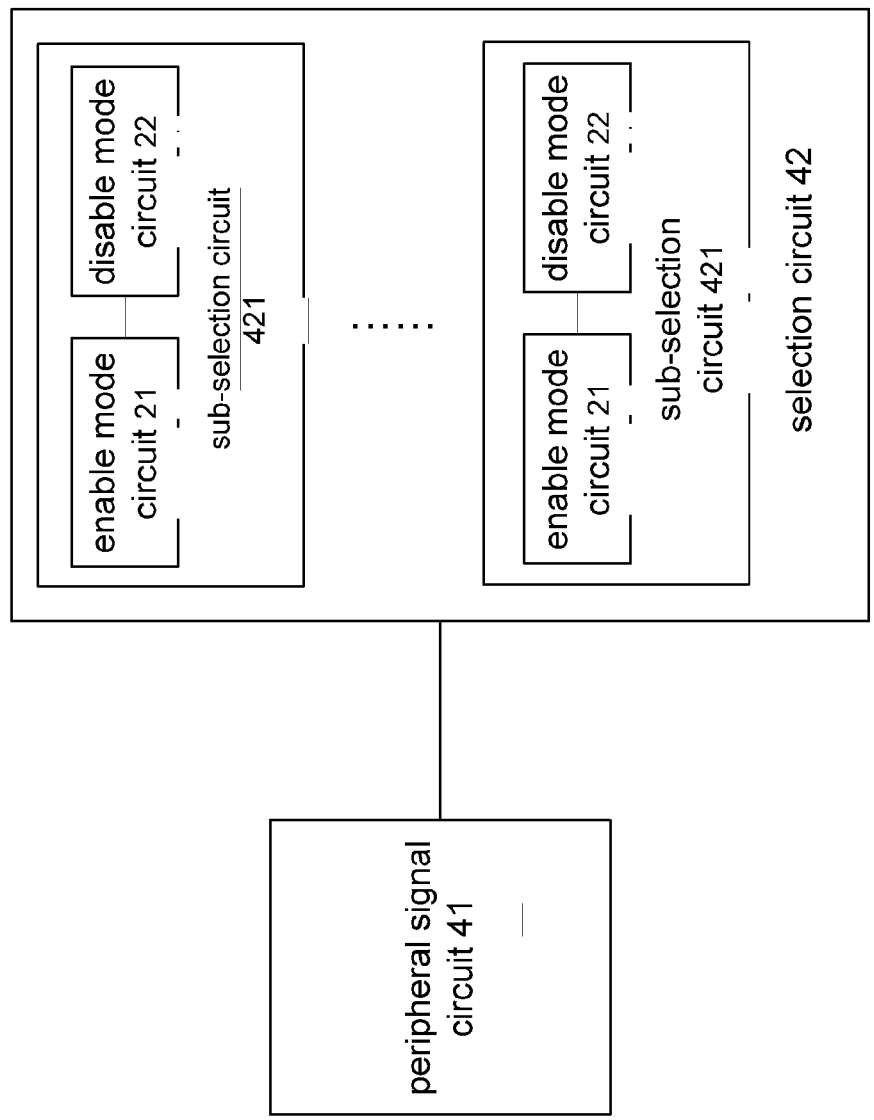
FIG. 4 is a schematic view of the structure of a maximum voltage selection circuit according to some embodiments.

In view of the sub-selection circuit described above, the disclosure also provides a maximum voltage selection circuit including a peripheral signal circuit 41 and a selection circuit 42 with N channels of input voltages, as shown in FIG. 4.

The peripheral signal circuit 41 provides an operating mode signal and a reference voltage to the selection circuit 42.

The selection circuit 42 includes N sub-selection circuits 421, N channels of input voltages are coupled to the N sub-selection circuits 421 respectively, each of the sub-selection circuits 421 determines its operating mode according to the operating mode signal, and when its input voltage is larger than the reference voltage in the operating mode, sets itself to the output enable state, sets the other sub-selection circuits to the output disable state, and outputs its input voltage as a maximum voltage through a PMOS.

The N sub-selection circuits 421 are shown in FIG. 2, each of the sub-selection circuit 421 including an enable mode circuit 21 and a disable mode circuit 22.

The enable mode circuit 21 is configured to operate when the operating mode signal is an enable signal. The enable mode circuit 21 includes a comparator, and when the input voltage of the enable mode circuit 21 is larger than a reference voltage, the enable mode circuit 21 sets itself to an output enable state, sets other sub-selection circuits to an output disable state, and outputs its input voltage as a maximum voltage through a PMOS.

The disable mode circuit 22 is configured to operate when the operating mode signal is a disable signal. The disable mode circuit 22 includes a power latch, and when the input voltage of the disable mode circuit 22 is larger than the reference voltage, the disable mode circuit 22 sets itself to the output enable state, sets the other sub-selection circuits to the output disable state, and outputs its input voltage as the maximum voltage through the PMOS.

When there is a bias current in the circuit, the operating mode signal having a high level is used as the enable signal, and when there is no bias current in the circuit, the operating mode signal having a low level is used as the disable signal.

The reference voltage may be the sum of a feedback voltage and voltages of related circuits. The feedback voltage can be an output voltage of the maximum voltage selection circuit fed back based on the operating mode signal.

Figure 5:
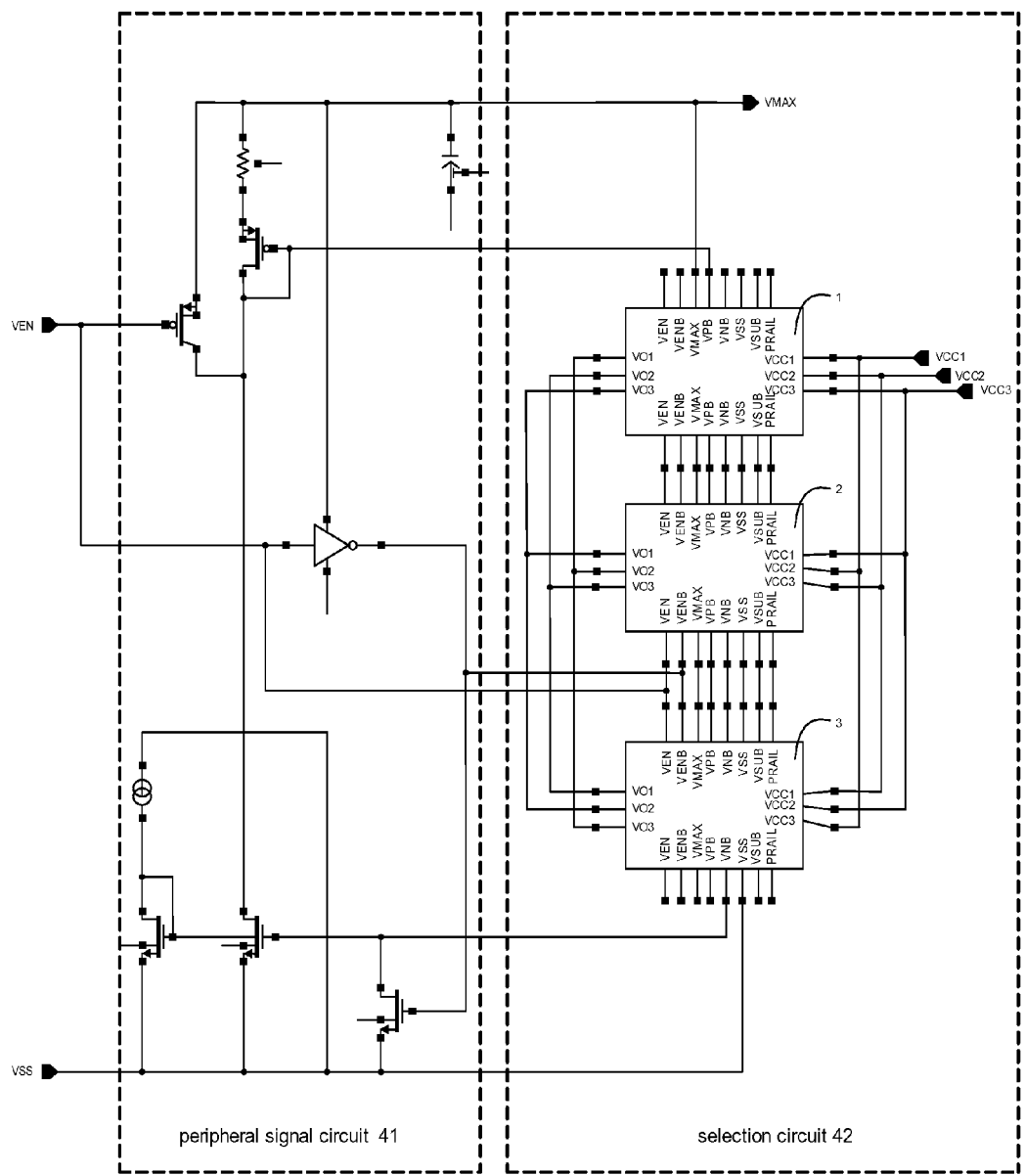
FIG. 5 is a schematic view of the specific structure of a maximum voltage selection circuit with three channels of input voltages according to some embodiments.

As shown in FIG. 5, the maximum voltage selection circuit includes a peripheral signal circuit 41 and a selection circuit 42 with three channels of input voltages, wherein the selection circuit 42 includes three sub-selection circuits, the state nodes of the three sub-selection circuits are connected to each other in turn, i.e., the state node VO1 of the first sub-selection circuit 1 itself is connected to the node VO2 of the second sub-selection circuit 2 and the node VO3 of the third sub-selection circuit 3, the state node VO1 of the second sub-selection circuit 2 itself is connected to the node VO2 of the first sub-selection circuit 1 and the node VO3 of the third sub-selection circuit 3, the state node VO1 of the third sub-selection circuit 3 itself is connected to the node VO3 of the first sub-selection circuit 1 and the node VO2 of the second sub-selection circuit 2; further, the input voltage nodes of the three sub-selection circuits are also connected to each other in turn.

As shown in FIG. 3, the first sub-selection circuit includes a first resistor R31, a second resistor R32, a third resistor R33, a first PMOS P31, a second PMOS P32, a third PMOS P33, a fourth PMOS P34, a fifth PMOS P35, a sixth PMOS P36, a seventh PMOS P37, a first NMOS N31, a second NMOS N32, a third NMOS N33, a fourth NMOS N34, a fifth NMOS N35, a sixth NMOS N36, and an inverter OP1.

An end of the first resistor R31 and the second resistor R32 connected in parallel is connected to the first input voltage VCC1, another end is connected to the source of the first PMOS P31. The gate of the first PMOS P31 is connected to a feedback voltage VPB. The drain of the first PMOS P31 is its state node VO1 and is connected to the input of the inverter OP1 and the drain of the third PMOS P33, the drain of the sixth PMOS P36, the drain of the first NMOS N31, the drain of the third NMOS N33 and the drain of the fifth NMOS N35. The gate of the first NMOS N31 is connected to the gate of the fourth NMOS N34 and a control signal VNB corresponding to an operating mode signal VEN. The source of the first NMOS N31 is connected to the drain of the second NMOS N32 and the source of the fourth NMOS N34. The gate of the second NMOS N32 is connected to the operating mode signal VEN, and the source is connected to a ground voltage VSS. The gate of the third NMOS N33 is a node VO2 for receiving the state of the second sub-selection circuit, and the source of the third NMOS N33 is connected to the drain of the fourth NMOS N34, the source of the fifth NMOS N35 and the drain of the sixth NMOS N36. The gate of the fifth NMOS N35 is a node VO3 for receiving the state of the third sub-selection circuit. The source of the sixth NMOS N36 is connected to the ground voltage VSS through the third resistor R33, and the gate of the sixth NMOS N36 is connected to an inverted signal VENB of the operating mode signal VEN. The source of the second PMOS P32 is connected to the first input voltage VCC1, the gate of the second PMOS P32 is connected to the operating mode signal VEN and the gate of the fourth PMOS P34, and the drain of the second PMOS P32 is connected to the source of the third PMOS P33. The gate of the third PMOS P33 is connected to the feedback voltage VPB. The source of the fourth PMOS P34 is connected to the first input voltage VCC1, and the drain of the fourth PMOS P34 is connected to the source of the fifth PMOS P35. The gate of the fifth PMOS P35 is the node VO3 for receiving the state of the third sub-selection circuit, and the drain of the fifth PMOS P35 is connected to the source of the sixth PMOS P36. The gate of the sixth PMOS P36 is the node VO2 for receiving the state of the second sub-selection circuit. The source of the seventh PMOS P37 is connected to the first input voltage VCC1, the gate of the seventh PMOS P37 is connected to the output of the inverter OP1, and the drain of the seventh PMOS P37 is connected to the output voltage VMAX.

In a more specific implementation, the first resistor R31 and the second resistor R32 may be implemented as one resistor.

When the operating mode signal VEN is at the high level, the first resistor R31, the second resistor R32, the first PMOS P31, the seventh PMOS P37, the first NMOS N31, the second NMOS N32, the third NMOS N33, the fourth NMOS N34, the fifth NMOS N35 and the inverter OP1 form the enable mode circuit 21. The first resistor R31, the second resistor R32, the first PMOS P31, the first NMOS N31, the second NMOS N32, the third NMOS N33, and the fourth NMOS N34 form the comparator structure. When the first input voltage VCC1 is larger than the reference voltage, the drain current of the first PMOS P31 will be larger than the sum of the drain currents of the first NMOS N31 and the fourth NMOS N34, and thus, its state node VO1 is set to be at the high level, i.e., output enable state, causing the second sub-selection circuit and the third sub-selection circuit to be in the output disable states through the state node VO1. That is, both the node VO2 and the node VO3 receive the low level, and then the seventh PMOS P37 is turned on and the output voltage VMAX of the drain of the seventh PMOS P37 is the first input voltage VCC1. The reference voltage is the sum of the feedback voltage VPB and a voltage VGSP. The voltage VGSP is the sum of the VGS of the first PMOS P31 and the voltage across the first resistor R31 or the second resistor R32 when the current of the first PMOS P31 is equal to the sum of the currents of the first NMOS N31 and the fourth NMOS N34.

Here, the seventh PMOS P37 in each of the other sub-selection circuits is turned off; in the sub-selection circuit under discussion, since both the third NMOS N33 and the fifth NMOS N35 are turned off in the current branch of the fourth NMOS N34, VCC1 may be maintained at the maximum value provided that the current of the first PMOS P31 is larger than that of the first NMOS N31; when a certain sub-selection circuit among the other sub-selection circuits is in the output enable state, in the sub-selection circuit under discussion, the current of the first PMOS P31 will be less than the sum of the currents of the first NMOS N31 and the fourth NMOS N34, thereby resulting in that the sub-selection circuit under discussion is in the output disable state, and the sub-selection circuit under discussion can be set to the output enable state only if the current of the first PMOS P31 is larger than the sum of the currents of the first NMOS N31 and the fourth NMOS N34.

When the operating mode signal VEN is at the low level, the third resistor R33, the second PMOS P32, the third PMOS P33, the fourth PMOS P34, the fifth PMOS P35, the sixth PMOS P36, the seventh PMOS P37, the third NMOS N33, the fifth NMOS N35, the sixth NMOS N36, and the inverter OP1 form the disable mode circuit 22. The third resistor R33, the second PMOS P32, the third PMOS P33, the fourth PMOS P34, the fifth PMOS P35, the sixth PMOS P36, the third NMOS N33, the fifth NMOS N35 and the sixth NMOS N36 form the power latch structure, when the first input voltage VCC1 is larger than the reference voltage, the third PMOS P33 is turned on, and thus, its state node VO1 is set to be high-level, i.e., output enable state, causing the second sub-selection circuit and the third sub-selection circuit to be in the output disable state through the state node VO1. That is, both the node VO2 and the node VO3 receive the low level, the all of the fourth PMOS P34, the fifth PMOS P35, and the sixth PMOS P36 are turned on, the output enable state of the state node VO1 is latched, the seventh PMOS P37 is turned on and the output voltage VMAX of the drain of the seventh PMOS P37 becomes the first input voltage VCC1. Here, the seventh PMOS P37 in each of the other sub-selection circuits is turned off. The reference voltage is the sum of the feedback voltage VPB, a VGS1 of the third PMOS P33 and a VGS2 of the second PMOS P32. The on-resistance of the third PMOS P33 is less than that of the third NMOS N33 and the fifth NMOS N35, which can allow the voltage of the state node VO1 to reach the threshold of the inverter OP1 when the third PMOS P33 is turned on.

Here, the third NMOS N33, the fifth NMOS N35, the fourth PMOS P34, the fifth PMOS P35 and the sixth PMOS P36 form a NOR gate with two inputs. When one of the other two sub-selection circuits is in the output enable state, the sub-selection circuit under discussion will turn into the output disable state. With regard to N channels of input voltages, a NOR gate with N−1 inputs corresponding to the sub-selection circuits for the respective channels of input voltages are required to generate the output enable state.

The first sub-selection circuit further includes a fourth resistor R34, a fifth resistor R35, an eighth PMOS P38 and a ninth PMOS P39. The source of the eighth PMOS P38 is connected to the first input voltage VCC1, the gate of the eighth PMOS P38 is connected to the second input voltage VCC2 through the fourth resistor R34, and the drain of the eighth PMOS P38 is connected to the source of the ninth PMOS P39. The gate of the ninth PMOS P39 is connected to the third input voltage VCC3 through the fifth resistor R35, and the drain of the ninth PMOS P39 is a voltage-protection output node PRAIL. When the first input voltage VCC1 is the largest, both the eighth PMOS P38 and the ninth PMOS P39 are turned on, and the voltage-protection output node PRAIL is at the first input voltage VCC1.

The circuit structures of the second sub-selection circuit and the third sub-selection circuit are the same as the first sub-selection circuit. However, the second sub-selection circuit is to determine whether the second input voltage VCC2 is the maximum voltage, and the third sub-selection circuit is to determine whether the third input voltage VCC3 is the maximum voltage.

In the maximum voltage selection circuit described above, when the PMOS transistor is turned on by outputting a low level voltage to the gate of the PMOS transistor through an inverter, the maximum voltage having a strong driving capability is output.

Figure 6:
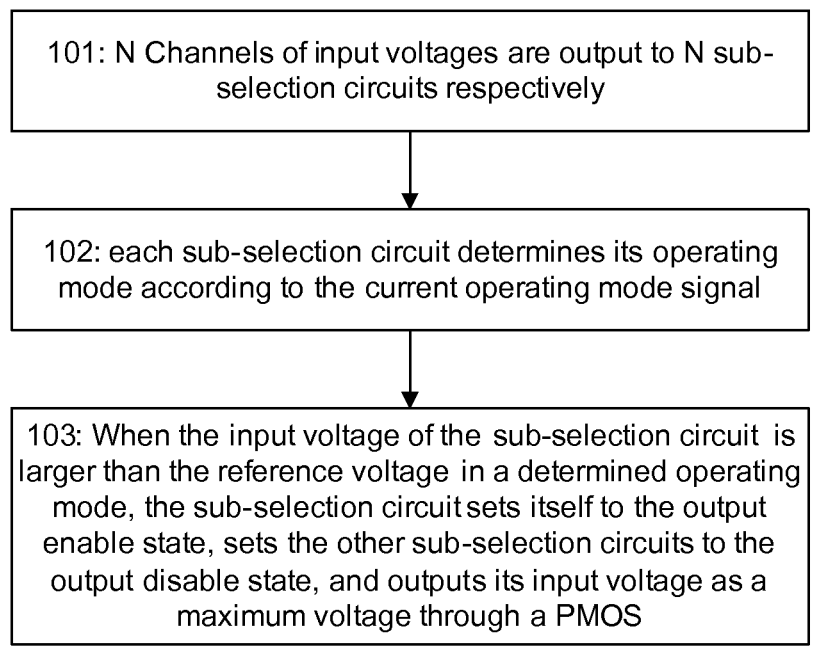
FIG. 6 is a flowchart of a maximum voltage selection method according to some embodiments.

In view of the maximum voltage selection circuit described above, the disclosure also provides a maximum voltage selection method, as shown in the flow diagram of FIG. 6. The method includes the following.

Block 101: N channels of input voltages are input to N sub-selection circuits respectively.

Block 102: Each sub-selection circuit determines its operating mode according to the current operating mode signal. The operating mode signal having the high level is used as an enable signal, and the operating mode signal having the low level is used as a disable signal.

Block 103: for each of the sub-selection circuits in a determined operating mode, when the input voltage is larger than the reference voltage, the sub-selection circuit sets itself to the output enable state, sets the other sub-selection circuits to the output disable state, and outputs its input voltage as a maximum voltage through a PMOS transistor.

In a more specific implementation, when the operating mode signal is the enable signal and it is determined that the input voltage is larger than a reference voltage by using a circuit of a comparator structure, the sub-selection circuit is set to an output enable state and the other sub-selection circuits are set to the output disable state, and the PMOS transistor is turned on to output a maximum voltage and the input voltage of the sub-selection circuit is output as the maximum voltage.

When the operating mode signal is the disable signal and it is determined that the input voltage is larger than a reference voltage by using a circuit of a power latch structure, the sub-selection circuit is set to an output enable state and the other sub-selection circuits are set to the output disable state, and the PMOS transistor is turned on to output a maximum voltage and the input voltage of the sub-selection circuit is output as the maximum voltage.

The reference voltage is an output voltage of the maximum voltage selection circuit fed back based on the operating mode signal.

Figure 7:
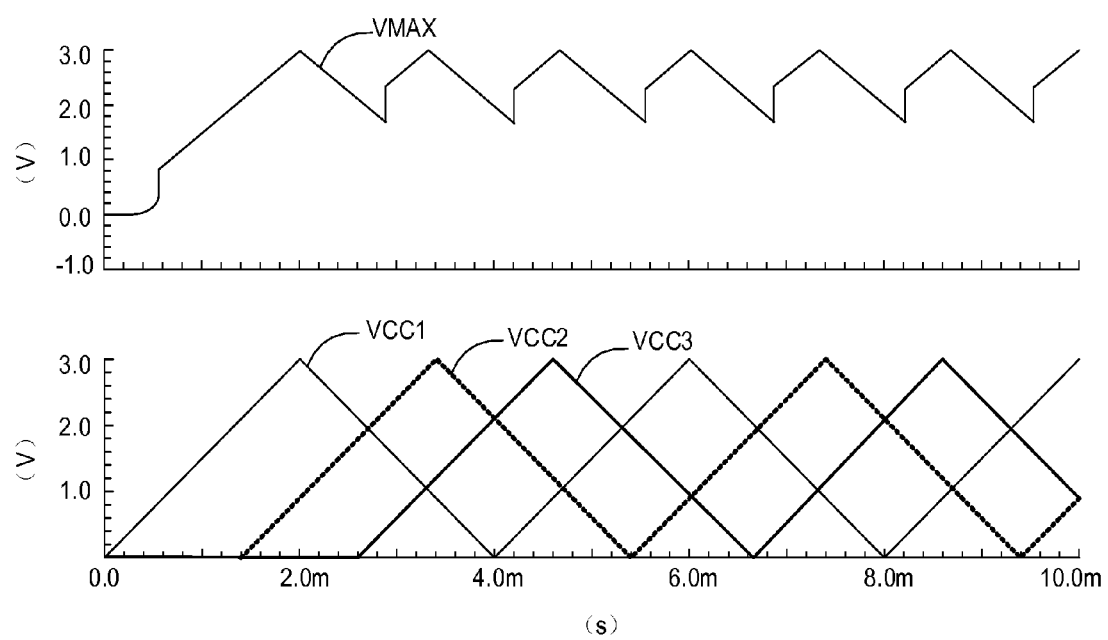
FIG. 7 is a schematic view of the operating state when the maximum voltage selection circuit operates in a disable mode according to some embodiments.
Figure 8:
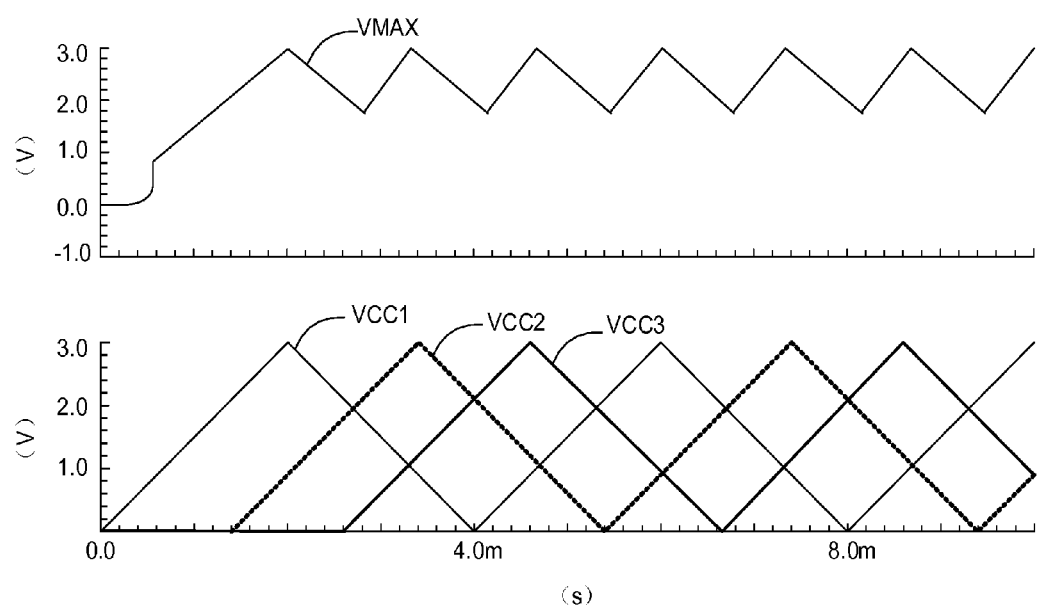
FIG. 8 is a schematic view of the operating state when the maximum voltage selection circuit operates in an enable mode according to some embodiments.

In the disclosure, tests are carried out on the maximum voltage selection circuit shown in FIG. 5 in an enable mode and a disable mode, respectively, and the results of the tests are shown in FIG. 7 and FIG. 8, respectively.

FIG. 7 shows an example of a timing diagram of the operating state of the maximum voltage selection circuit operating in a disable mode. It can be seen that the output voltage VMAX of the maximum voltage selection circuit is the first input voltage VCC1 in the beginning. When the first input voltage VCC1 is equal to the second input voltage VCC2, the maximum voltage selection circuit continues to output the first input voltage VCC1. When the second input voltage VCC2 is larger than the first input voltage VCC1 by a certain threshold, the output voltage VMAX of the maximum voltage selection circuit is the second input voltage VCC2. When the second input voltage VCC2 is equal to the third input voltage VCC3, the maximum voltage selection circuit continues to output the second input voltage VCC2. When the third input voltage VCC3 is larger than the second input voltage VCC2 by a certain threshold, the output voltage VMAX of the maximum voltage selection circuit is the third input voltage VCC3. Therefore, the maximum voltage selection circuit can ensure that the output voltage is normal when the voltage differences between the multi-voltages are relatively small or the same in the disable mode. Here, the threshold may be adjusted by adjusting the driving capability of the PMOS of the disable mode circuit in the maximum voltage selection circuit.

FIG. 8 shows an example of a timing diagram of the operating state of the maximum voltage selection circuit operating in an enable mode. It can be seen that the threshold, at which the maximum voltage selection circuit selects to switch the maximum voltage, is smaller, and the selection of the maximum voltage is more sensitive when compared to the operating state of the maximum voltage selection circuit operating in the disable mode.

What are described above are merely examples and are not intended to limit the scope of the disclosure. The above description is intended to be illustrative, and not restrictive. The above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A sub-selection circuit, comprising an enable mode circuit and a disable mode circuit,
wherein the enable mode circuit includes a comparator, and is configured to operate when an operating mode signal is an enable signal, and to set itself to an output enable state, set other sub-selection circuits to an output disable state, and output its input voltage as a maximum voltage through a P-type metal oxide semiconductor field effect transistor (PMOS transistor) when its input voltage is larger than a reference voltage, and wherein the disable mode circuit includes a power latch, and is configured to operate when the operating mode signal is a disable signal, and to set itself to the output enable state, set other sub-selection circuits to the output disable state, and output its input voltage as the maximum voltage through the PMOS transistor when its input voltage is larger than the reference voltage.

2. The sub-selection circuit according to claim 1, wherein when there is a bias current in the sub-selection circuit, the operating mode signal having a high level is used as the enable signal, and when there is no bias current in the circuit, the operating mode signal having a low level is used as the disable signal.

3. The sub-selection circuit according to claim 2, wherein when the sub-selection circuit is a first sub-selection circuit, the sub-selection circuit includes: a first resistor, a second resistor, a third resistor, a first PMOS transistor, a second PMOS transistor, a third PMOS transistor, a fourth PMOS transistor, a fifth PMOS transistor, a sixth PMOS transistor, a seventh PMOS transistor, a first N-type metal oxide semiconductor field effect transistor (NMOS transistor), a second NMOS transistor, a third NMOS transistor, a fourth NMOS transistor, a fifth NMOS transistor, a sixth NMOS transistor and an inverter, wherein an end of the first resistor and the second resistor connected in parallel is connected to a first input voltage, another end is connected to a source of the first PMOS transistor, a gate of the first PMOS transistor is connected to a feedback voltage, and a drain of the first PMOS transistor is connected to a state node VO1 of the first PMOS transistor, and is connected to an input of the inverter, a drain of the third PMOS transistor, a drain of the sixth PMOS transistor, a drain of the first NMOS transistor, a drain of the third NMOS transistor and a drain of the fifth NMOS transistor, wherein a gate of the first NMOS transistor is connected to a gate of the fourth NMOS transistor and a control signal corresponding to the operating mode signal, and a source of the first NMOS transistor is connected to the drain of the second NMOS transistor and the source of the fourth NMOS transistor, wherein a gate of the second NMOS transistor is connected to the operating mode signal, and a source of the second NMOS transistor is connected to a ground voltage, wherein a gate of the third NMOS transistor is connected to a node VO2 for receiving a state of a second sub-selection circuit, a source of the third NMOS transistor is connected to a drain of the fourth NMOS transistor, a source of the fifth NMOS transistor and a drain of the sixth NMOS transistor, wherein a gate of the fifth NMOS transistor is connected to a node VO3 for receiving a state of a third sub-selection circuit, wherein a source of the sixth NMOS transistor is connected to the ground voltage through the third resistor, and a gate of the sixth NMOS transistor is connected to an inverted signal of the operating mode signal, wherein a source of the second PMOS transistor is connected to the first input voltage, a gate of the second PMOS transistor is connected to the operating mode signal and a gate of the fourth PMOS transistor, a drain of the second PMOS transistor is connected to a source of the third PMOS transistor, wherein a gate of the third PMOS transistor is connected to the feedback voltage, wherein a source of the fourth PMOS transistor is connected to the first input voltage, and a drain of the fourth PMOS transistor is connected to a source of the fifth PMOS transistor, wherein a gate of the fifth PMOS transistor is connected to a node VO3 for receiving a state of the third sub-selection circuit, and a drain of the fifth PMOS transistor is connected to the source of the sixth PMOS transistor, wherein a gate of the sixth PMOS transistor is connected to the node VO2 for receiving the state of the second sub-selection circuit, and wherein a source of the seventh PMOS transistor is connected to the first input voltage, a gate of the seventh PMOS transistor is connected to an output of the inverter, and a drain of the seventh PMOS transistor is connected to an output voltage.

4. The sub-selection circuit according to claim 3, wherein when the operating mode signal of the first sub-selection circuit is at the high level, the first resistor, the second resistor, the first PMOS transistor, the seventh PMOS transistor, the first NMOS transistor, the second NMOS transistor, the third NMOS transistor, the fourth NMOS transistor, the fifth NMOS transistor and the inverter form the enable mode circuit.

5. The sub-selection circuit according to claim 4, wherein the first resistor, the second resistor, the first PMOS transistor, the first NMOS transistor, the second NMOS transistor, the third NMOS transistor and the fourth NMOS transistor form the comparator, when the first input voltage is larger than the reference voltage, a drain current of the first PMOS transistor is larger than a sum of drain currents of the first NMOS transistor and the fourth NMOS transistor, the enable mode circuit of the first sub-selection circuit sets the state node VO1 to the output enable state, and causes the second sub-selection circuit and the third sub-selection circuit to be in the output disable state through the state node VO1, the seventh PMOS transistor is turned on and the output voltage of the drain of the seventh PMOS transistor is the first input voltage, and wherein the reference voltage is a sum of the feedback voltage, a gate-source voltage of the first PMOS transistor and a voltage across the first resistor.

6. The sub-selection circuit according to claim 3, wherein the third resistor, the second PMOS transistor, the third PMOS transistor, the fourth PMOS transistor, the fifth PMOS transistor, the sixth PMOS transistor, the seventh PMOS transistor, the third NMOS transistor, the fifth NMOS transistor, the sixth NMOS transistor and the inverter form the disable mode circuit when the operating mode signal is at the low level.

7. The sub-selection circuit according to claim 6, wherein the third resistor, the second PMOS transistor, the third PMOS transistor, the fourth PMOS transistor, the fifth PMOS transistor, the sixth PMOS transistor, the third NMOS transistor, the fifth NMOS transistor and the sixth NMOS transistor form the power latch, when the first input voltage is larger than the reference voltage, the third PMOS transistor is turned on, the disable mode circuit of the first sub-selection circuit sets the state node VO1 to the output enable state, and causes the second sub-selection circuit and the third sub-selection circuit to be in the output disable state through the state node VO1, the fourth PMOS transistor, the fifth PMOS transistor and the sixth PMOS transistor are turned on, the output enable state of the state node VO1 is latched, the seventh PMOS transistor is turned on and the output voltage of the drain of the seventh PMOS transistor is the first input voltage, and
    wherein the reference voltage is a sum of the feedback voltage, a gate-source voltage of the second PMOS transistor and a gate-source voltage of the third PMOS transistor.

8. The sub-selection circuit according to claim 3, wherein the first sub-selection circuit further includes a fourth resistor, a fifth resistor, an eighth PMOS transistor and a ninth PMOS transistor, and
    wherein a source of the eighth PMOS transistor is connected to the first input voltage, a gate of the eighth PMOS transistor is connected to a second input voltage through the fourth resistor, and a drain of the eighth PMOS transistor is connected to a source of the ninth PMOS transistor, and
    wherein a gate of the ninth PMOS transistor is connected to a third input voltage through the fifth resistor, and a drain of the ninth PMOS transistor is connected to a voltage-protection output node.

9. A maximum voltage selection circuit, comprising a peripheral signal circuit and a selection circuit with N channels of input voltages, wherein N is a positive integer greater than zero,
    wherein the peripheral signal circuit provides an operating mode signal and a reference voltage to the selection circuit,
    wherein the selection circuit includes N sub-selection circuits coupled to N channels of input voltages respectively, each of the sub-selection circuits determines its operating mode according to the operating mode signal, and when its input voltage is larger than the reference voltage in the operating mode, sets itself to the output enable state, sets other sub-selection circuits to the output disable state, and outputs the input voltage as a maximum voltage through a PMOS transistor.

10. The maximum voltage selection circuit according to claim 9, wherein each of the N sub-selection circuits includes an enable mode circuit and a disable mode circuit,
    wherein the enable mode circuit includes a comparator, and is configured to operate when an operating mode signal is an enable signal, and to set itself to an output enable state, set other sub-selection circuits to an output disable state, and output its input voltage as a maximum voltage through a P-type metal oxide semiconductor field effect transistor (PMOS transistor) when its input voltage is larger than a reference voltage, and
    wherein the disable mode circuit includes a power latch, and is configured to operate when the operating mode signal is an disable signal, and to set itself to the output enable state, set other sub-selection circuits to the output disable state, and output its input voltage as the maximum voltage through the PMOS transistor when its input voltage is larger than the reference voltage.

11. The maximum voltage selection circuit according to claim 10, wherein N=3, there are three sub-selection circuits, and state nodes of the three sub-selection circuits are connected to each other in turn.

12. The maximum voltage selection circuit according to claim 11, wherein a first sub-selection circuit in the three sub-selection circuits includes: a first resistor, a second resistor, a third resistor, a first PMOS transistor, a second PMOS transistor, a third PMOS transistor, a fourth PMOS transistor, a fifth PMOS transistor, a sixth PMOS transistor, a seventh PMOS transistor, a first N-type metal oxide semiconductor field effect transistor (NMOS transistor), a second NMOS transistor, a third NMOS transistor, a fourth NMOS transistor, a fifth NMOS transistor, a sixth NMOS transistor and an inverter,
    wherein an end of the first resistor and the second resistor connected in parallel is connected to a first input voltage, another end is connected to a source of the first PMOS transistor, a gate of the first PMOS transistor is connected to a feedback voltage, and a drain of the first PMOS transistor is connected to a state node VO1 of the first PMOS transistor, and is connected to an input of the inverter, a drain of the third PMOS transistor, a drain of the sixth PMOS transistor, a drain of the first NMOS transistor, a drain of the third NMOS and a drain of the fifth NMOS transistor,
    wherein a gate of the first NMOS transistor is connected to a gate of the fourth NMOS transistor and a control signal corresponding to the operating mode signal, and a source of the first NMOS transistor is connected to the drain of the second NMOS transistor and the source of the fourth NMOS transistor,
    wherein a gate of the second NMOS transistor is connected to the operating mode signal, and a source of the second NMOS transistor is connected to a ground voltage,
    wherein a gate of the third NMOS transistor is connected to a node VO2 for receiving a state of a second sub-selection circuit, a source of the third NMOS transistor is connected to a drain of the fourth NMOS transistor, a source of the fifth NMOS transistor and a drain of the sixth NMOS transistor,
    wherein a gate of the fifth NMOS transistor is connected to a node VO3 for receiving a state of a third sub-selection circuit,
    wherein a source of the sixth NMOS transistor is connected to the ground voltage through the third resistor, and a gate of the sixth NMOS transistor is connected to an inverted signal of the operating mode signal,
    wherein a source of the second PMOS transistor is connected to the first input voltage, a gate of the second PMOS transistor is connected to the operating mode signal and a gate of the fourth PMOS transistor, a drain of the second PMOS transistor is connected to a source of the third PMOS transistor,
    wherein a gate of the third PMOS transistor is connected to the feedback voltage,
    wherein a source of the fourth PMOS transistor is connected to the first input voltage, and a drain of the fourth PMOS transistor is connected to a source of the fifth PMOS transistor,
    wherein a gate of the fifth PMOS transistor is connected to a node VO3 for receiving a state of the third sub-selection circuit, and a drain of the fifth PMOS transistor is connected to the source of the sixth PMOS transistor,
    wherein a gate of the sixth PMOS transistor is connected to the node VO2 for receiving the state of the second sub-selection circuit, and
    wherein a source of the seventh PMOS transistor is connected to the first input voltage, a gate of the seventh PMOS transistor is connected to an output of the inverter, and a drain of the seventh PMOS transistor is connected to an output voltage.

13. The maximum voltage selection circuit according to claim 12, wherein the first resistor, the second resistor, the first PMOS transistor, the seventh PMOS transistor, the first NMOS transistor, the second NMOS transistor, the third NMOS transistor, the fourth NMOS transistor, the fifth NMOS transistor and the inverter form the enable mode circuit when the operating mode signal of the first sub-selection circuit is at the high level.

14. The maximum voltage selection circuit according to claim 13, wherein the first resistor, the second resistor, the first PMOS transistor, the first NMOS transistor, the second NMOS transistor, the third NMOS transistor and the fourth NMOS transistor form the comparator structure, when the first input voltage is larger than the reference voltage, a drain current of the first PMOS transistor is larger than a sum of drain currents of the first NMOS transistor and the fourth NMOS transistor, the enable mode circuit of the first sub-selection circuit sets the state node VO1 to the output enable state, and causes the second sub-selection circuit and the third sub-selection circuit to be in the output disable state through the state node VO1, the seventh PMOS transistor is turned on and the output voltage of the drain of the seventh PMOS transistor is the first input voltage, and wherein the reference voltage is a sum of the feedback voltage, a gate-source voltage of the first PMOS transistor and a voltage across the first resistor.

15. The maximum voltage selection circuit according to claim 12, wherein the third resistor, the second PMOS transistor, the third PMOS transistor, the fourth PMOS transistor, the fifth PMOS transistor, the sixth PMOS transistor, the seventh PMOS transistor, the third NMOS transistor, the fifth NMOS, the sixth NMOS transistor and the inverter form the disable mode circuit when the operating mode signal is at the low level.

16. The maximum voltage selection circuit according to claim 15, wherein the third resistor, the second PMOS transistor, the third PMOS transistor, the fourth PMOS transistor, the fifth PMOS transistor, the sixth PMOS transistor, the third NMOS transistor, the fifth NMOS transistor and the sixth NMOS transistor form a power latch structure, when the first input voltage is larger than the reference voltage, the third PMOS transistor is turned on, the disable mode circuit of the first sub-selection circuit sets the state node VO1 to the output enable state, and causes the second sub-selection circuit and the third sub-selection circuit to be in the output disable state through the state node VO1, the fourth PMOS transistor, the fifth PMOS transistor and the sixth PMOS transistor are turned on, the output enable state of the state node VO1 is latched, the seventh PMOS transistor is turned on and the output voltage of the drain of the seventh PMOS transistor is the first input voltage, and wherein the reference voltage is a sum of the feedback voltage, a gate-source voltage of the second PMOS transistor and a gate-source voltage of the third PMOS transistor.

17. The maximum voltage selection circuit according to claim 12, wherein the first sub-selection circuit further includes a fourth resistor, a fifth resistor, a eighth PMOS and a ninth PMOS transistor, and wherein a source of the eighth PMOS transistor is connected to the first input voltage, a gate of the eighth PMOS transistor is connected to a second input voltage through the fourth resistor, and a drain of the eighth PMOS transistor is connected to a source of the ninth PMOS transistor, and wherein a gate of the ninth PMOS transistor is connected to a third input voltage through the fifth resistor, and a drain of the ninth PMOS transistor is connected to a voltage-protection output node.

18. A maximum voltage selection method, comprising:

connecting N channels of input voltages to N sub-selection circuits respectively, wherein N is a positive integer greater than zero;

determining, by a sub-selection circuit, its operating mode according to a current operating mode signal; and when an input voltage to the sub-selection circuit is larger than the reference voltage in the determined operating mode, setting itself to the output enable state, setting other sub-selection circuits to the output disable state, and outputting its input voltage as a maximum voltage through a PMOS transistor.

19. The maximum voltage selection method according to claim 18, wherein the operating mode signal having a high level is used as an enable signal and the operating mode signal having a low level is used as a disable signal.

20. The maximum voltage selection method according to claim 19, wherein the setting itself to the output enable state, setting other sub-selection circuits to the output disable state, and outputting its input voltage as a maximum voltage through a PMOS transistor when its input voltage is larger than the reference voltage in a determined operating mode comprises:

when the operating mode signal is the enable signal and it is determined that its input voltage is larger than the reference voltage by using a circuit of a comparator structure, setting itself to the output enable state and setting the other sub-selection circuits to the output disable state, and turning on the PMOS transistor to output a maximum voltage and outputting its input voltage as the maximum voltage, and when the operating mode signal is the disable signal and it is determined that its input voltage is larger than the reference voltage by using a circuit of a power latch structure, setting itself to the output enable state and setting the other sub-selection circuits to the output disable state, and turning on the PMOS transistor to output a maximum voltage and outputting its input voltage as the maximum voltage.

* * * * *